United States Patent [19]

Esgar et al.

[11] Patent Number: 5,444,395
[45] Date of Patent: Aug. 22, 1995

[54] NON-SATURATING BIPOLAR TRANSISTOR CIRCUIT

[75] Inventors: Dwight D. Esgar, Mesa; Ray D. Sundstrom; Phuc C. Pham, both of Chandler, all of Ariz.

[73] Assignee: Motorola, Inc., Schaumburg, Ill.

[21] Appl. No.: 161,559

[22] Filed: Dec. 6, 1993

[51] Int. Cl.$^6$ ............... H03K 19/0175; H03K 17/04
[52] U.S. Cl. ...................... 326/73; 327/310; 327/375; 327/379; 327/482; 327/489
[58] Field of Search ............... 307/248, 253, 254, 264, 307/270, 299.1, 300, 475, 571; 326/63, 66, 73; 327/419, 478, 482, 489, 306, 309, 310, 108, 479, 477, 379, 375

[56] References Cited

U.S. PATENT DOCUMENTS

| | | | |
|---|---|---|---|
| 3,073,969 | 1/1963 | Skillen | 307/254 |
| 3,766,406 | 10/1973 | Bryant et al. | 307/475 |
| 4,135,103 | 1/1979 | Fulkerson | 307/455 |
| 4,194,135 | 3/1980 | Christopherson | 307/264 |
| 4,242,604 | 12/1980 | Smith | 307/475 |
| 4,303,831 | 12/1981 | El Hamamsy | 307/571 |
| 4,789,797 | 12/1988 | Vasseghi | 307/475 |
| 5,332,932 | 7/1994 | Runaldue | 307/475 |
| 5,332,935 | 7/1993 | Shyu | 307/475 |

Primary Examiner—Terry D. Cunningham
Attorney, Agent, or Firm—Gary W. Hoshizaki

[57] ABSTRACT

A non-saturating transistor circuit (11) having a first terminal (13), a control terminal (12), and a second terminal (14). The first terminal (13), control terminal (12), and second terminal (14) correspond respectively to a collector, base, and emitter of a transistor. The non-saturating transistor circuit (11) comprises a voltage divider (15), a diode (19), and a transistor (16). The voltage divider (15) enables the transistor (16) when a voltage is applied across the control terminal (12) and the second terminal (14) of non-saturating transistor circuit (11). The diode (19) removes current drive to the transistor (16) prior to the transistor (16) becoming saturated thus preventing the transistor (16) from saturating under all operating conditions.

15 Claims, 3 Drawing Sheets

11

31

41

71

NON-SATURATING BIPOLAR TRANSISTOR CIRCUIT

BACKGROUND OF THE INVENTION

This invention relates, in general, to non-saturating bipolar transistor circuits, and more particularly to translator circuits for converting ECL levels to CMOS levels.

It is well known that a bipolar transistor driven into saturation greatly increases the time needed to turn the device off. Saturation is defined by both collector-base and base-emitter junctions of a bipolar transistor being forward biased. Circuits having bipolar transistors which operate in deep saturation may have increased delays that are unacceptable for many applications.

One application that is prone to deep saturation is an output stage that operates near the power supply voltages. As an example, an ECL (emitter coupled logic) to CMOS (complementary metal oxide semiconductor) level translator operates near its supply voltages. A CMOS one logic level is at the positive most potential of the circuit while a CMOS zero logic level is at the most negative potential of the circuit (typically ground). Because CMOS logic levels are at the supply voltages of the translator circuit it is difficult not to deeply saturate transistors generating these signal levels.

One well known method for preventing a bipolar transistor from saturating is to couple a Schottky diode from base to collector of the bipolar transistor. The Schottky diode has a lower turn on voltage than a standard base-collector junction, thus it is enabled before the bipolar transistor saturates. The enabled Schottky diode removes base drive from the bipolar transistor keeping it from deep saturation. The one drawback to using the Schottky diode is that it takes extra processing steps to form the device and is not available on every bipolar process flow.

It would be of great benefit if a non-saturating bipolar transistor circuit could be provided that can be implemented on a standard bipolar process flow without additional processing steps.

DETAILED DESCRIPTION OF THE DRAWINGS

Figure 1:
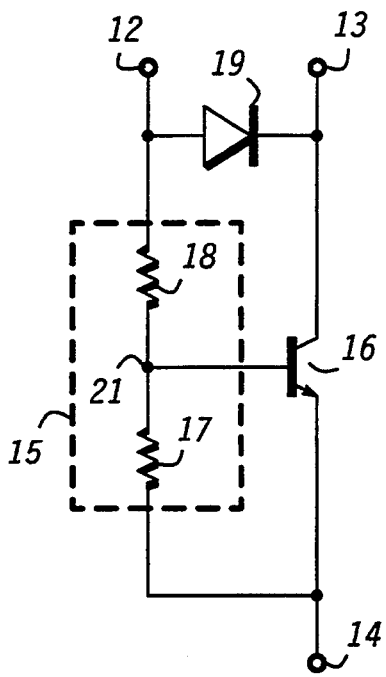
FIG. 1 is a schematic of a non-saturating npn bipolar transistor circuit.

FIG. 1 is a schematic diagram of a non-saturating npn bipolar transistor circuit 11 having terminals 12, 13, and 14. Non-saturating npn bipolar transistor circuit 11 comprises transistor 16, voltage divider 15, and diode 19. Transistor 16 is an npn transistor having a collector, base, and emitter corresponding respectively to a first electrode, control electrode, and second electrode. Transistor 16 has a collector coupled to terminal 13, a base coupled to a node 21, and an emitter coupled to terminal 14. In the preferred embodiment, voltage divider 15 comprises resistors 17 and 18. Resistor 17 has a first terminal coupled to node 21 and a second terminal coupled to terminal 14. Resistor 18 has a first terminal coupled to terminal 12 and a second terminal coupled to node 21. Diode 19 has an anode and cathode corresponding to a first terminal and a second terminal. Diode 19 has the anode coupled to terminal 12 and the cathode coupled to terminal 13.

Operation of non-saturating npn bipolar transistor circuit 11 is described hereinafter. Non-saturating npn bipolar transistor circuit 11 is operated as a transistor with terminals 12, 13, and 14 corresponding respectively to a base, collector, and emitter of the transistor. A voltage applied to input 12 is divided by voltage divider 15 with a predetermined ratio of the voltage biasing the base-emitter junction of transistor 16. Voltage divider 15 is a resistor divider well known by one skilled in the art. Other known voltage divider circuits such as ratioed transistors can also be used.

As the voltage applied to input 12 increases it begins to forward bias the base-emitter junction of transistor 16. Under normal or small signal conditions diode 19 is reverse biased with the voltage at terminal 13 greater than the voltage at terminal 12. Diode 19 prevents transistor 16 from saturating as the voltage at terminal 13 approaches the voltage at terminal 14. Diode 19 is enabled before the base-collector junction of transistor 16 is significantly forward biased. Diode 19 removes base drive from transistor 16 to the collector. A key feature is that voltage divider 15 requires a voltage greater than a diode voltage drop from terminal 12 to terminal 14 to enable transistor 16. This insures that a substantial collector-emitter voltage is always provided across transistor 16.

For example, assume a diode or Vbe/Vbc junction has a forward bias voltage of 0.7 volts when enabled. A one volt signal applied to terminal 12 (and voltage divider 15) generates 0.7 volts at node 21 thereby enabling transistor 16. Further increases in voltage (albeit small in magnitude) at terminal 12 greatly increase the current of transistor 16 causing the voltage at terminal 13 to fall towards the voltage at terminal 14. Diode 19 is enabled when the voltage at terminal 13 falls to approximately 0.3 volts (0.7 volts across diode 19). Base current to transistor 16 is diverted to the collector limiting drive to transistor 16. This prevents the collector to emitter voltage (Vce) from falling below 300 millivolts and keeping transistor 16 from saturating (Vbc is approximately 0.4 volts). The term non-saturating used in non-saturating npn bipolar transistor 11 (and other circuitry described hereinafter) is not meant to imply that transistor 16 is not in saturation. Technically, transistor 16 is in saturation when the collector-base junction is forward biased. Non-saturating npn bipolar transistor 11 keeps transistor 16 from going into deep saturation. In the example above the base-collector voltage is forward biased (0.4 volts) which is technically in saturation but is not forward biased enough to put it into hard saturation that could increase circuit delay. It should be noted that the ratio chosen for the voltage divider is also function of the diode and transistor characteristics and the application in which the circuit is used.

Figure 2:
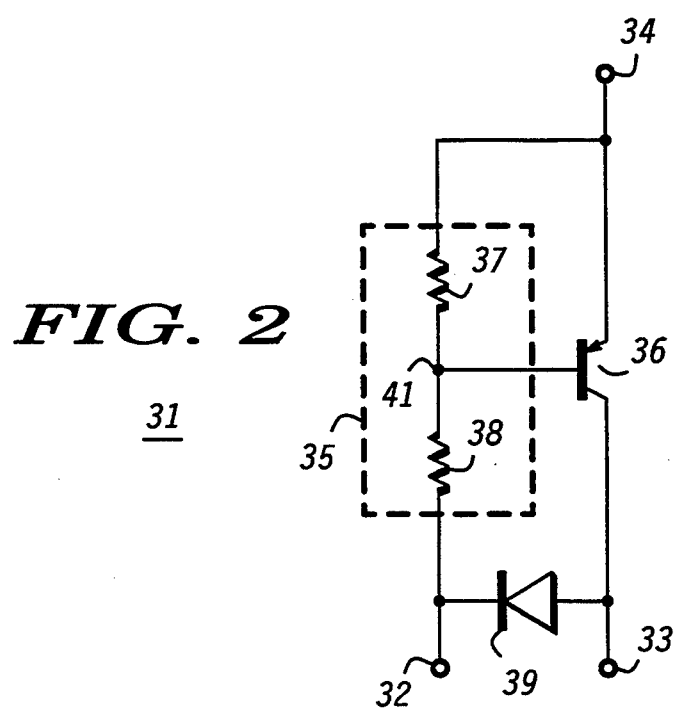
FIG. 2 is a schematic of a non-saturating pnp bipolar transistor circuit.

FIG. 2 is a schematic diagram of a non-saturating pnp bipolar transistor circuit 31 having terminals 32, 33, and 34. Non-saturating pnp bipolar transistor circuit 31 comprises transistor 36, voltage divider 35, and diode 39. Non-saturating pnp bipolar transistor 31 is a complement of non-saturating npn bipolar transistor 11 of FIG. 1. Transistor 36 is a pnp transistor having a collector, base, and emitter corresponding respectively to a first electrode, control electrode, and second electrode. Transistor 36 has a collector coupled to terminal 33, a base coupled to a node 41, and an emitter coupled to terminal 34. In the preferred embodiment, voltage divider 35 comprises resistors 37 and 38. Resistor 37 has a first terminal coupled to node 41 and a second terminal coupled to terminal 34. Resistor 38 has a first terminal coupled to terminal 32 and a second terminal coupled to node 41. Diode 39 has an anode and cathode corresponding to a first terminal and a second terminal. Diode 39 has the anode coupled to terminal 33 and the cathode coupled to terminal 32.

Operation of non-saturating pnp bipolar transistor circuit 31 is described hereinafter. Non-saturating pnp bipolar transistor circuit 31 is similar in operation to non-saturating npn bipolar transistor 11 shown in FIG. 1. Non-saturating pnp bipolar transistor circuit 31 is operated as a transistor with terminals 32, 33, and 34 corresponding respectively to a base, collector, and emitter of the transistor. A voltage applied to input 32 is divided by voltage divider 35 and enables the base-emitter junction of transistor 36.

As the voltage applied to input 32 decreases it begins to forward bias the base-emitter junction of transistor 36. Under normal or small signal conditions diode 39 is reverse biased with the voltage at terminal 33 less than the voltage at terminal 32. Diode 39 prevents transistor 36 from saturating as the voltage at terminal 33 approaches the voltage at terminal 34. Diode 39 is enabled before the base-collector junction of transistor 36 is significantly forward biased. Diode 39 reduces base drive to transistor 36. A key feature is that voltage divider 35 requires a voltage greater than a diode voltage drop from terminal 32 to terminal 34 to enable transistor 36. This insures that a substantial collector-emitter voltage is always provided across transistor 36.

Figure 3:
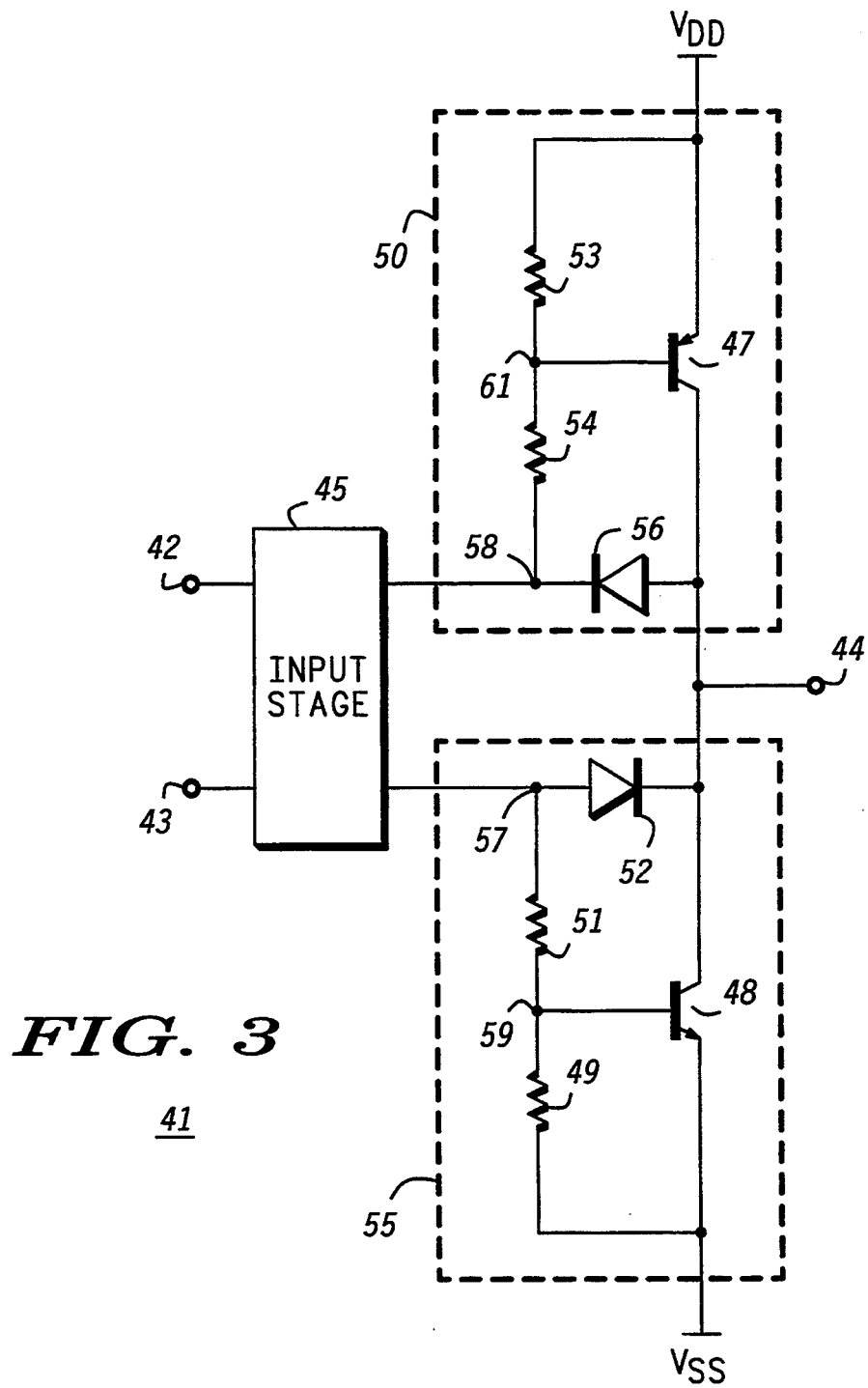
FIG. 3 is a schematic of an input stage and a complementary non-saturating output stage.

FIG. 3 is a schematic of an input stage 45 and a complementary non-saturating output stage 46. Input stage 45 and complementary non-saturating output stage 46 form an amplifier 41. Amplifier 41 includes an input 42, an input 43, and an output 44. Amplifier 41 amplifies a differential voltage applied to inputs 42 and 43 and provides a single ended output voltage at output 44.

Input stage 45 has a first input and a second input coupled respectively to input 42 and input 43 of amplifier 41, a first output coupled to a node 58, and a second output coupled to a node 57.

Complementary non-saturating output stage 46 comprises transistors 47 and 48, diodes 52 and 56, and resistors 49, 51, 53, and 54. Transistors 47 and 48 have a collector, base, and emitter corresponding respectively to a first electrode, control electrode, and second electrode. Diodes 52 and 56 have an anode and cathode corresponding respectively to a first terminal and a second terminal.

A non-saturating pnp bipolar transistor circuit 50 similar to that shown in FIG. 2 is formed by transistor 47, diode 56, and resistors 53 and 54. Transistor 47 has the emitter coupled for receiving a supply voltage VDD, the base coupled to a node 61, and the collector coupled to output 44. Resistor 53 has a first terminal coupled to node 61 and a second terminal coupled for receiving the supply voltage VDD. Resistor 54 has a first terminal coupled to node 58 and a second terminal coupled to node 61. Diode 56 has the anode coupled to output 44 and the cathode coupled to node 58.

A non-saturating npn bipolar transistor circuit 55 similar to that shown in FIG. 1 is formed by transistor 48, diode 52, and resistors 49 and 51. Transistor 48 has the collector coupled to output 44, the base coupled to a node 59, and the emitter coupled for receiving a supply voltage VSS. Resistor 51 has a first terminal coupled to node 57 and a second terminal coupled to node 59. Resistor 49 has a first terminal coupled to node 59 and a second terminal coupled for receiving the supply voltage VSS.

Operation of amplifier 41 is described hereinafter. Input stage 45 amplifies a differential voltage applied across inputs 42 and 43. Input stage 45 couples amplified signals to complementary non-saturating output stage 46 at nodes 57 and 58. Non-saturating pnp and npn bipolar transistor circuits 50 and 55 prevent transistors 47 and 48 from saturating as output 44 approaches supply voltages VDD and VSS.

Complementary non-saturating output stage 46 can be operated biased or unbiased. In a biased mode, transistors 47 and 48 are biased with a current when no signal is applied across inputs 42 and 43. In an unbiased mode, transistors 47 and 48 are off when no signal is applied across inputs 42 and 43.

A positive voltage transition at output 44 is generated when input stage 45 decreases the voltage at nodes 57 and 58. Decreasing voltage at node 58 increases current provided by transistor 47. Decreasing voltage at node 57 decreases current provided by transistor 48. This yields a net positive current sourced by transistor 57 causing the positive voltage transition.

Conversely, a negative voltage transition at output 44 is generated when input stage 45 increases the voltage at nodes 57 and 58. Increasing voltage at node 58 decreases current provided by transistor 47. Increasing voltage at node 58 increases current of transistor 48. This yields a net negative current at output 44 producing the negative voltage transition.

Large positive or large negative differential voltage signals applied to inputs 42 and 43 do not saturate transistors 47 and 48 because of non-saturating pnp and npn bipolar transistor circuits 50 and 55. This allows amplifier 41 to rapidly respond to changes in the input signals applied to inputs 42 and 43.

Figure 4:
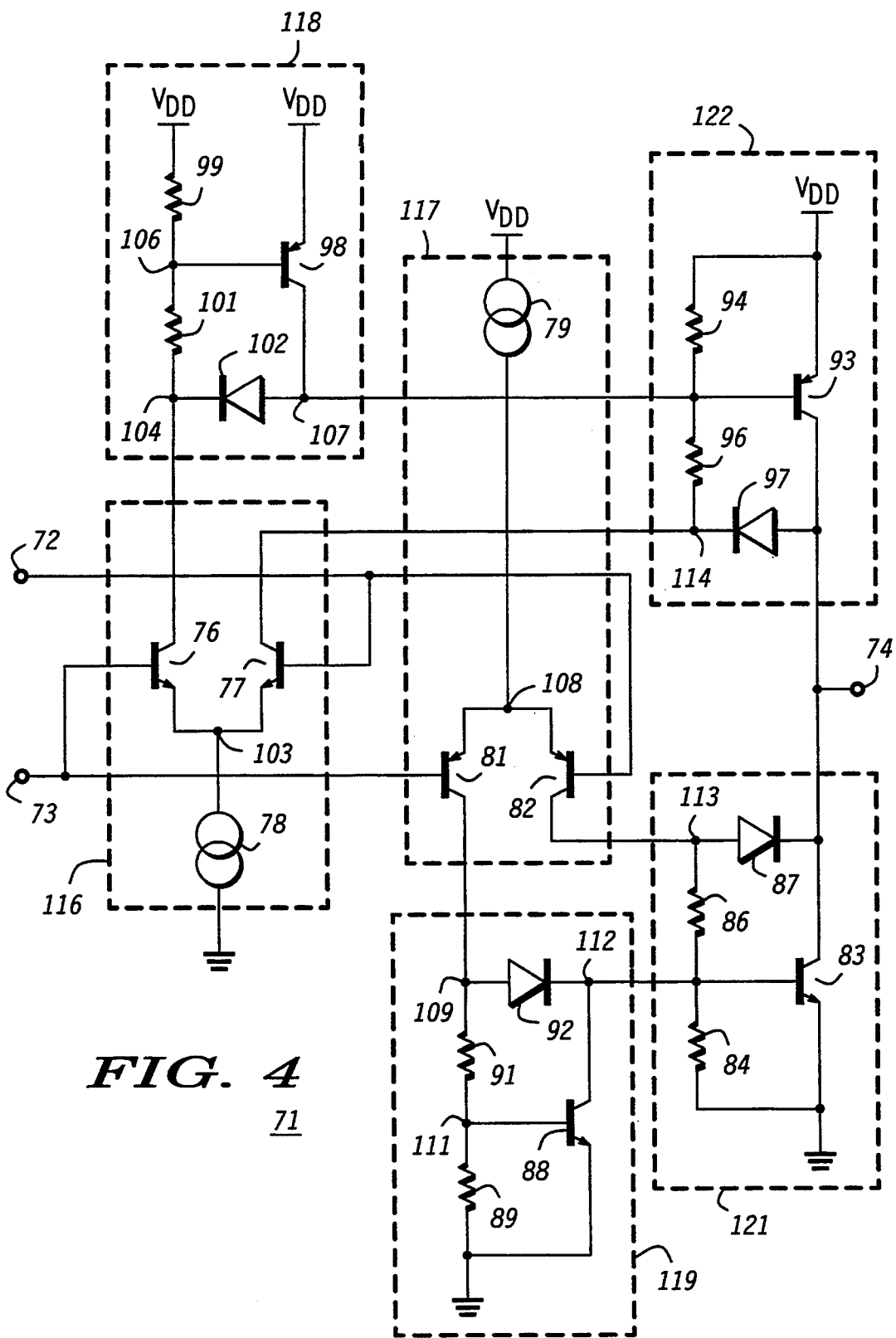
FIG. 4 is a schematic of a translator circuit in accordance with the present invention.

FIG. 4 is a schematic of a translator circuit 71 for translating an ECL(emitter coupled logic) signal to a CMOS (complementary metal oxide semiconductor) signal. Translator circuit 71 has an input 72, an input 73, and an output 74. Translator circuit 71 comprises differential input stages 116 and 117, pnp non-saturating bipolar transistor circuits 118 and 122, and npn non-saturating bipolar transistor circuits 119 and 121. Transistors 76, 77, 81–83, 88, 93, and 98 have a collector, base, and emitter corresponding to a first electrode, control electrode, and second electrode. Transistors 76, 77, 83, and 88 are npn transistors. Transistors 81, 82, 93, and 98 are pnp transistors. Diodes 87, 92, 97, and 102 have an anode and cathode corresponding to a first terminal and a second terminal.

Differential input stage 116 comprises transistors 76 and 77, and current source 78. Transistor 76 has the collector coupled to a node 104, the base coupled to input 73, and the emitter coupled to a node 103. Transistor 77 has the collector coupled to a node 114, the base coupled to input 72 and the emitter coupled to node 103. Current source 78 biases transistors 76 and 77 and has a terminal coupled to node 103.

Differential input stage 117 comprises transistors 81 and 82, and current source 79. Transistor 81 has the collector coupled to a node 109, the base coupled to input 73, and the emitter coupled to a node 108. Transistor 82 has the collector coupled to a node 113, the base coupled to input 72 and the emitter coupled to node 108. Current source 79 biases transistors 81 and 82 and has a terminal coupled to node 108.

Non-saturating pnp bipolar transistor circuit 118 comprises transistor 98, diode 102, and resistors 99 and 101. Non-saturating pnp transistor circuit 118 prevents transistor 98 from saturating and operates similar to non-saturating pnp transistor 31 shown in FIG. 2. Transistor 98 has the collector coupled to a node 107, the base coupled to a node 106, and the emitter coupled for receiving a voltage VDD. Diode 102 has the anode coupled to node 107 and the cathode coupled to node 104. Resistor 99 has a first terminal coupled to node 106 and a second terminal coupled for receiving the supply voltage VDD. Resistor 101 has a first terminal coupled to node 104 and a second terminal coupled to node 106.

Non-saturating npn bipolar transistor circuit 119 comprises transistor 88, diode 92, and resistors 89 and 91. Non-saturating npn transistor circuit 119 prevents transistor 88 from saturating and operates similar to non-saturating npn transistor 11 shown in FIG. 1. Transistor 88 has the collector coupled to a node 112, the base coupled to a node 111, and the emitter coupled to ground. Diode 92 has the anode coupled to node 109 and the cathode coupled to node 112. Resistor 89 has a first terminal coupled to node 111 and a second terminal coupled to ground. Resistor 91 has a first terminal coupled to node 109 and a second terminal coupled to node 111.

Non-saturating npn bipolar transistor circuit 121 comprises transistor 83, diode 87, and resistors 84 and 86. Non-saturating npn transistor circuit 121 prevents transistor 83 from saturating and operates similar to non-saturating npn transistor 11 shown in FIG. 1. Transistor 83 has the collector coupled to output 74, the base coupled to a node 112, and the emitter coupled to ground. Diode 87 has the anode coupled to node 113 and the cathode coupled to output 74. Resistor 84 has a first terminal coupled to node 112 and a second terminal coupled to ground. Resistor 86 has a first terminal coupled to node 113 and a second terminal coupled to node 112.

Non-saturating pnp bipolar transistor circuit 122 comprises transistor 93, diode 97, and resistors 94 and 96. Non-saturating pnp transistor circuit 122 prevents transistor 93 from saturating and operates similar to non-saturating pnp transistor 31 shown in FIG. 2. Transistor 93 has the collector coupled to output 74, the base coupled to a node 107, and the emitter coupled for receiving the supply voltage VDD. Diode 97 has the anode coupled to output 74 and the cathode coupled to node 114. Resistor 94 has a first terminal coupled to node 107 and a second terminal coupled for receiving supply voltage VDD. Resistor 96 has a first terminal coupled to node 114 and a second terminal coupled to node 107.

Operation of translator circuit 71 is described hereinafter. Translator circuit 71 translates an ECL level signal to a CMOS level signal. ECL and CMOS level signals are well known by one skilled in the art. ECL level signals are known as high speed, small magnitude signals. CMOS level signal are high noise immunity, large magnitude signals. Translator circuit 71 amplifies and converts a differential ECL signal to a signal ended CMOS signal.

Translator circuit 71 is responsive to a differential voltage (ECL signal) applied across inputs 72 and 73. In a first case, a voltage at input 72 is greater than a voltage at input 73 (positive input voltage). The positive input voltage is applied across the bases of transistors 81 and 82 of differential input stage 117. This increases current through transistor 81 and decreases current through transistor 82. The current provided by transistor 81 enables transistor 88 of non-saturating npn bipolar transistor 119 for removing base drive from transistor 83 thereby rapidly turning non-saturating npn bipolar transistor 121 off. Transistor 88 will not saturate so non-saturating npn bipolar transistor circuit 119 can be rapidly turned off. Non-saturating npn bipolar transistor circuit 121 remains off with the positive input voltage applied since the current provided by transistor 82 is not enough to enable transistor 83.

The positive input voltage applied across the bases of transistors 76 and 77 increases current through transistor 77 and decreases current through transistor 76. The current provided by transistor 76 does not enable transistor 98 of non-saturating pnp bipolar transistor circuit 118. The current provided by transistor 77 enables transistor 93 by increasing base drive to non-saturating pnp bipolar transistor circuit 122. Thus, transistor 93 sources current at output 74 producing a positive transition until transistor 93 nears saturation at which point non-saturating pnp bipolar transistor 122 removes base drive from transistor 93.

In a second case, a voltage at input 72 is less than a voltage at input 73 (negative input voltage). The negative input voltage is applied across the bases of transistors 76 and 77 of differential input stage 116. This increases current through transistor 76 and decreases current through transistor 77. The current provided by transistor 76 enables transistor 98 of non-saturating pnp bipolar transistor 118 for removing base drive from transistor 93 thereby rapidly turning non-saturating pnp bipolar transistor 122 off. Transistor 98 will not saturate so non-saturating pnp bipolar transistor circuit 118 can be rapidly turned off. Non-saturating pnp bipolar transistor circuit 122 remains off with the negative input voltage applied since the current provided by transistor 77 is not enough to enable transistor 93.

The negative input voltage applied across the bases of transistors 81 and 82 increases current through transistor 82 and decreases current through transistor 81. The current provided by transistor 81 does not enable transistor 88 of non-saturating npn bipolar transistor circuit 119. The current provided by transistor 82 enables transistor 83 by increasing base drive to non-saturating npn bipolar transistor circuit 121. Thus, transistor 83 provides a sink current at output 74 producing a negative transition until transistor 83 nears saturation, at which point non-saturating npn bipolar transistor 121 removes base drive from transistor 83. Translator circuit 71 is easily implemented on standard bipolar processes and provides a high speed ECL to CMOS level conversion.

By now it should be appreciated that a non-saturating bipolar transistor circuit has been provided. The non-saturating bipolar transistor circuit is easily implemented on a standard bipolar process flow and allows small collector-emitter voltage drops across a transistor without saturation.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A translator circuit for translating an emitter coupled logic signal to a CMOS (complementary metal oxide semiconductor) signal including a first input, a second input, and an output, the translator circuit comprising:
   a first input stage having a first input and a second input coupled respectively to the first and second inputs of the translator circuit, a first output, and a second output;
   a second input stage having a first input and a second input coupled respectively to the first and second inputs of the translator circuit, a first output, and a second output;
   a first non-saturating transistor circuit having a control terminal coupled to the first output of the first input stage, a first terminal coupled to the output of the translator circuit and a second terminal coupled for receiving a first supply voltage, said first non-saturating transistor circuit comprising:
      a voltage divider circuit having a first terminal coupled to said control terminal of said first non-saturating transistor circuit, a second terminal, and a third terminal coupled to said second terminal of said first non-saturating transistor circuit;
      a diode having a first terminal and a second terminal coupled respectively to said first terminal and said control terminal of said first non-saturating transistor circuit; and
      a transistor having a first electrode coupled to said first terminal of said first non-saturating transistor circuit, a control electrode coupled to said second terminal of said voltage divider circuit, and a second electrode coupled to said third terminal of said voltage divider circuit;
   a second non-saturating transistor circuit having a control terminal coupled to said first output of said second input stage, a first terminal coupled to the output of the translator circuit, and a second terminal coupled for receiving a second supply voltage; and
   a third non-saturating transistor circuit for disabling said first non-saturating transistor circuit including a control terminal coupled to said second output of said first input stage, a first terminal coupled to said control electrode of said transistor, and a second terminal coupled for receiving said first supply voltage.

2. A translator circuit as recited in claim 1 wherein said third non-saturating transistor circuit comprises:
   a voltage divider circuit having a first terminal coupled to said control terminal of said third non-saturating transistor circuit, a second terminal, and a third terminal coupled to said second terminal of said third non-saturating transistor circuit;
   a diode having a first terminal and a second terminal coupled respectively to said first terminal and said control terminal of said third non-saturating transistor circuit; and
   a transistor having a first electrode coupled to said first terminal of said third non-saturating transistor circuit, a control electrode coupled to said second terminal of said voltage divider circuit, and a second electrode coupled to said third terminal of said voltage divider circuit.

3. A translator circuit as recited in claim 1 wherein said second non-saturating transistor circuit comprises:
   a voltage divider circuit having a first terminal coupled to said control terminal of said second non-saturating transistor circuit, a second terminal, and a third terminal coupled to said second terminal of said second non-saturating transistor circuit;
   a diode having a first terminal and a second terminal coupled respectively to said control terminal and said first terminal of said second non-saturating transistor circuit; and
   a transistor having a first electrode coupled to said first terminal of said second non-saturating transistor circuit, a control electrode coupled to said second terminal of said voltage divider circuit, and a second electrode coupled to said third terminal of said voltage divider circuit.

4. A translator circuit as recited in claim 3 wherein said voltage divider circuit of said second non-saturating transistor circuit comprises:
   a first resistor having a first terminal and a second terminal coupled respectively to said first and second terminals of said voltage divider circuit; and
   a second resistor having a first terminal and a second terminal coupled respectively to said second and third terminals of said voltage divider circuit.

5. A translator circuit as recited in claim 3 further including a fourth non-saturating transistor circuit for disabling said second non-saturating transistor circuit including a control terminal coupled to said second output of said second input stage, a first terminal coupled to said control electrode of said transistor of said second non-saturating transistor circuit, and a second terminal coupled for receiving said second supply voltage.

6. A translator circuit as recited in claim 5 wherein said fourth non-saturating transistor circuit comprises:
   a voltage divider circuit having a first terminal coupled to said control terminal of said fourth non-saturating transistor circuit, a second terminal, and a third terminal coupled to said second terminal of said fourth non-saturating transistor circuit;
   a diode having a first terminal and a second terminal coupled respectively to said control terminal and said first terminal of said fourth non-saturating transistor circuit; and
   a transistor having a first electrode coupled to said first terminal of said fourth non-saturating transistor circuit, a control electrode coupled to said second terminal of said voltage divider circuit, and a second electrode coupled to said third terminal of said voltage divider circuit.

7. A translator circuit as recited in claim 1 wherein said first input stage comprises:
   a first transistor of a first conductivity type having a first electrode and control electrode coupled respectively to said first output and said first input of said first input stage, and a second electrode;
   a second transistor of said first conductivity type having a first electrode and control electrode coupled respectively to said second output and said second input of said first input stage, and a second electrode coupled to said second electrode of said first transistor; and a current source for having a terminal coupled to said second electrode of said first transistor.

8. A translator circuit as recited in claim 7 wherein said second input stage comprises:
 a first transistor of a second conductivity type having a first electrode and control electrode coupled respectively to said first output and said first input of said second input stage, and a second electrode;
 a second transistor of said second conductivity type having a first electrode and control electrode coupled respectively to said second output and said second input of said second input stage, and a second electrode coupled to said second electrode of said first transistor; and
 a current source for having a terminal coupled to said second electrode of said first transistor.

9. A translator circuit as recited in claim 1 wherein said voltage divider circuit comprises:
 a first resistor having a first terminal and a second terminal coupled respectively to said first and second terminals of said voltage divider circuit; and
 a second resistor having a first terminal and a second terminal coupled respectively to said second and third terminals of said voltage divider circuit.

10. A translator circuit for translating an emitter coupled logic signal to a CMOS (complementary metal oxide semiconductor) signal including a first input, a second input, and an output, the translator circuit comprising:
 a first input stage having a first input and a second input coupled respectively to the first and second inputs of the translator circuit, a first output, and a second output;
 a second input stage having a first input and a second input coupled respectively to the first and second inputs of the translator circuit, a first output, and a second output;
 a first non-saturating transistor circuit having a control terminal coupled to the first output of the first input stage, a first terminal coupled to the output of the translator circuit and a second terminal coupled for receiving a first supply voltage;
 a second non-saturating transistor circuit having a control terminal coupled to said first output of said second input stage, a first terminal coupled to the output of the translator circuit, and a second terminal coupled for receiving a second supply voltage;
 a third non-saturating transistor circuit for disabling said first non-saturating transistor circuit including a control terminal coupled to said second output of said first input stage, a first terminal coupled to said first non-saturating transistor circuit, and a second terminal coupled for receiving said first supply voltage.

11. The translator circuit as recited in claim 10 wherein said first non-saturating transistor circuit comprises:
 a voltage divider circuit having a first terminal coupled to said control terminal of said first non-saturating transistor circuit, a second terminal, and a third terminal coupled to said second terminal of said first non-saturating transistor circuit;
 a diode having a first terminal and a second terminal coupled respectively to said first terminal and said control terminal of said first non-saturating transistor circuit; and
 a transistor having a first electrode coupled to said first terminal of said first non-saturating transistor circuit, a control electrode coupled to said second terminal of said voltage divider circuit, and a second electrode coupled to said third terminal of said voltage divider circuit.

12. The translator circuit as recited in claim 10 wherein said second non-saturating transistor circuit comprises:
 a voltage divider circuit having a first terminal coupled to said control terminal of said second non-saturating transistor circuit, a second terminal, and a third terminal coupled to said second terminal of said second non-saturating transistor circuit;
 a diode having a first terminal and a second terminal coupled respectively to said control terminal and said first terminal of said second non-saturating transistor circuit; and
 a transistor having a first electrode coupled to said first terminal of said second non-saturating transistor circuit, a control electrode coupled to said second terminal of said voltage divider circuit, and a second electrode coupled to said third terminal of said voltage divider circuit.

13. A translator circuit as recited in claim 10 wherein said third non-saturating transistor circuit comprises:
 a voltage divider circuit having a first terminal coupled to said control terminal of said third non-saturating transistor circuit, a second terminal, and a third terminal coupled to said second terminal of said third non-saturating transistor circuit;
 a diode having a first terminal and a second terminal coupled respectively to said first terminal and said control terminal of said third non-saturating transistor circuit; and
 a transistor having a first electrode coupled to said first terminal of said third non-saturating transistor circuit, a control electrode coupled to said second terminal of said voltage divider circuit, and a second electrode coupled to said third terminal of said voltage divider circuit.

14. A translator circuit as recited in claim 10 further including a fourth non-saturating transistor circuit for disabling said second non-saturating transistor circuit including a control terminal coupled to said second output of said second input stage, a first terminal coupled to said second non-saturating transistor circuit, and a second terminal coupled for receiving said second supply voltage.

15. A translator circuit as recited in claim 14 wherein said fourth non-saturating transistor circuit comprises:
 a voltage divider circuit having a first terminal coupled to said control terminal of said fourth non-saturating transistor circuit, a second terminal, and a third terminal coupled to said second terminal of said fourth non-saturating transistor circuit;
 a diode having a first terminal and a second terminal coupled respectively to said control terminal and said first terminal of said fourth non-saturating transistor circuit; and
 a transistor having a first electrode coupled to said first terminal of said fourth non-saturating transistor circuit, a control electrode coupled to said second terminal of said voltage divider circuit, and a second electrode coupled to said third terminal of said voltage divider circuit.

* * * * *